United States Patent
Kamimura et al.

(10) Patent No.: US 12,525,469 B2
(45) Date of Patent: Jan. 13, 2026

(54) SUBSTRATE PROCESSING METHOD AND SUBSTRATE PROCESSING APPARATUS

(71) Applicant: Tokyo Electron Limited, Tokyo (JP)

(72) Inventors: Fumihiro Kamimura, Kumamoto (JP); Teruomi Minami, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 131 days.

(21) Appl. No.: 17/573,933

(22) Filed: Jan. 12, 2022

(65) Prior Publication Data
US 2022/0230893 A1 Jul. 21, 2022

(30) Foreign Application Priority Data
Jan. 18, 2021 (JP) ................... 2021-005966

(51) Int. Cl.
*H01L 21/67* (2006.01)
*H01L 21/687* (2006.01)

(52) U.S. Cl.
CPC .... *H01L 21/6704* (2013.01); *H01L 21/68764* (2013.01)

(58) Field of Classification Search
CPC ....................................................... B05D 1/005
See application file for complete search history.

(56) References Cited

U.S. PATENT DOCUMENTS

| 9,111,967 B2* | 8/2015 | Sekiguchi | H01L 21/02057 |
| 9,305,767 B2* | 4/2016 | Nishi | H01L 21/02052 |
| 9,735,026 B2* | 8/2017 | Brown | G03F 7/423 |
| 2018/0337067 A1* | 11/2018 | Kosai | B08B 3/041 |

FOREIGN PATENT DOCUMENTS

| JP | 2015-041751 A | 3/2015 |
| JP | 2017-168699 A | 9/2017 |

* cited by examiner

*Primary Examiner* — Dah-Wei D. Yuan
*Assistant Examiner* — Kristen A Dagenais
(74) *Attorney, Agent, or Firm* — Venjuris, P.C.

(57) ABSTRACT

A substrate processing method includes: supplying a pre-wet liquid to a substrate while rotating the substrate, and forming a liquid film of the pre-wet liquid on a surface of the substrate; supplying a chemical liquid at a first flow rate to the substrate while the substrate is being rotated at a first rotation speed, and processing the substrate with the chemical liquid to form a liquid film of the chemical liquid having a first thickness on the surface of the substrate; and supplying the chemical liquid to the substrate at a second supply flow rate while the substrate is being rotated at a second rotation speed, and performing a second chemical liquid processing on the substrate with the chemical liquid to form a liquid film of the chemical liquid having a second thickness on the surface of the substrate.

12 Claims, 5 Drawing Sheets

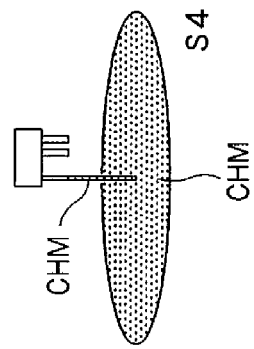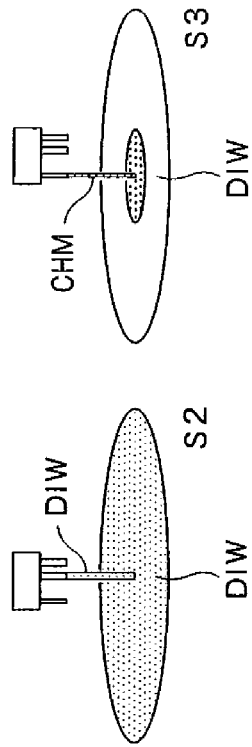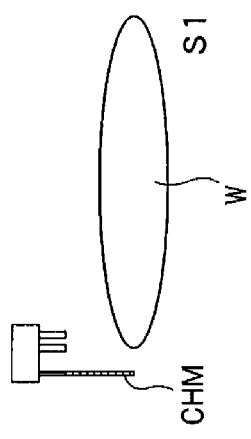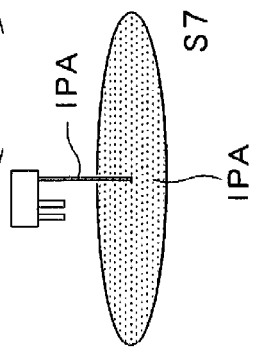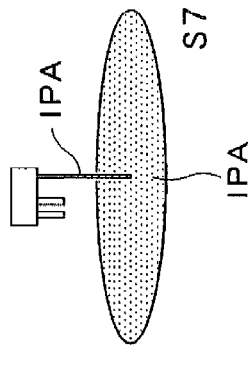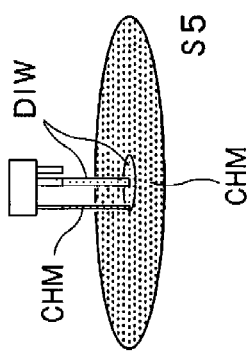
FIG. 5A  FIG. 5B  FIG. 5C  FIG. 5D
FIG. 5E  FIG. 5F  FIG. 5G  FIG. 5H

SUBSTRATE PROCESSING METHOD AND SUBSTRATE PROCESSING APPARATUS

CROSS-REFERENCE TO RELATED APPLICATIONS

This application is based on and claims priority from Japanese Patent Application No. 2021-005966 filed on Jan. 18, 2021 with the Japan Patent Office, the disclosure of which is incorporated herein in its entirety by reference.

TECHNICAL FIELD

The present disclosure relates to a substrate processing method and a substrate processing apparatus.

BACKGROUND

A process for manufacturing a semiconductor device includes a liquid processing in which a processing liquid such as a chemical liquid for etching or cleaning is supplied to a substrate to perform a predetermined liquid processing on the substrate. In order to reduce the particles remaining on the substrate after the liquid processing, it is required to reduce the particles contained in the processing liquid supplied to the substrate. The particles contained in the processing liquid include the particles generated from a control valve that adjusts the flow rate of the processing liquid supplied to a liquid processing unit, and Japanese Patent Laid-Open Publication No. 2015-041751 discloses a substrate processing apparatus equipped with means for reducing such particles.

The substrate processing apparatus disclosed in Japanese Patent Laid-Open Publication No. 2015-041751 includes a first line connected to a processing liquid supply source, a pump that sends the processing liquid from the processing liquid supply source to the first line, a plurality of second lines that is connected to the first line and into which the processing liquid flowing through the first line flows, a branch line connected to a branch point on each second line, a liquid processing unit that performs a processing on a substrate with the processing liquid supplied via each branch line, an orifice provided on the upstream side of the branch point on each second line, and a first control valve provided on the downstream side of the branch point on each second line. The first control valve changes the amount of processing liquid that flows to the downstream side of the first control valve to control the pressure of the processing liquid in the section of the corresponding second line between the orifice and the first control valve, and control the flow rate of the processing liquid supplied to the corresponding liquid processing unit via the corresponding branch line. According to the above configuration, since it is not necessary to interpose a control valve for adjusting the flow rate in the branch line, particles that may be generated from such a control valve do not flow to the liquid processing unit.

SUMMARY

A substrate processing method according to an embodiment includes: supplying a pre-wet liquid to a substrate while the substrate is being rotated, and forming a liquid film of the pre-wet liquid on a surface of the substrate; after the forming of the liquid film of the pre-wet liquid, supplying a chemical liquid to the substrate at a first flow rate while the substrate is being rotated at a first rotation speed, and performing a first chemical liquid processing on the substrate with the chemical liquid to form a liquid film of the chemical liquid having a first thickness on the surface of the substrate; and after the first chemical liquid processing, supplying the chemical liquid to the substrate at a second flow rate to the substrate while the substrate is being rotated at a second rotation speed, and performing a second chemical liquid processing on the substrate with the chemical liquid to form a liquid film of the chemical liquid having a second thickness on the surface of the substrate. The pre-wet liquid is a liquid different from the chemical liquid and having a higher cleanliness than the chemical liquid used at the processings of the substrate with the chemical liquid. The first flow rate is larger than the second flow rate, and the first thickness is thicker than the second thickness.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIGS. 5A to 5H are schematic views illustrating a discharge situation of the processing liquid in each step of the liquid processing.

DETAILED DESCRIPTION

In the following detailed description, reference is made to the accompanying drawing, which form a part hereof. The illustrative embodiments described in the detailed description, drawings, and claims are not meant to be limiting. Other embodiments may be utilized, and other changes may be made without departing from the spirit or scope of the subject matter presented here.

An embodiment of a substrate processing apparatus will be described with reference to the accompanying drawings.

Figure 1:
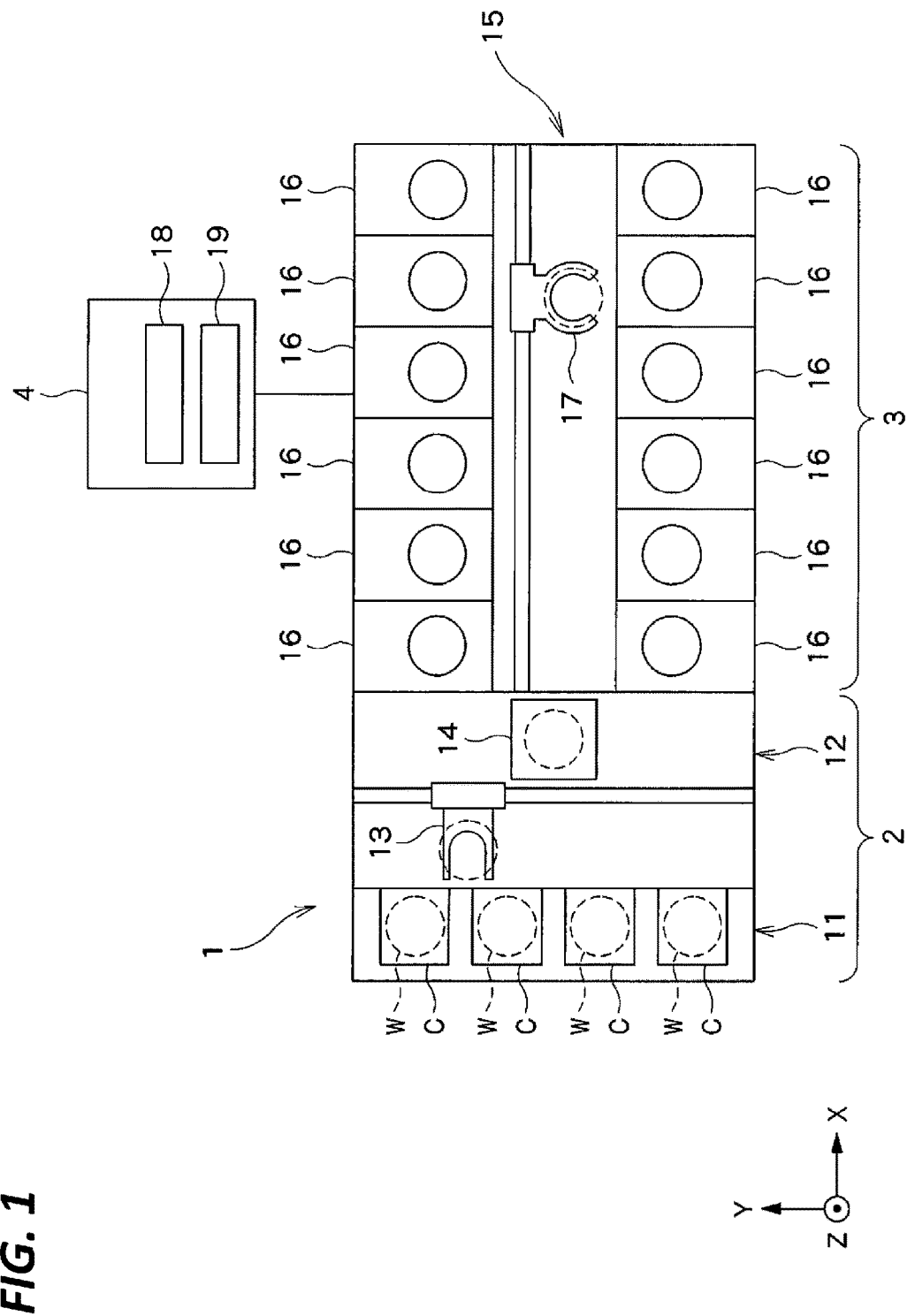
FIG. 1 is a schematic cross-sectional view illustrating a configuration of a substrate processing system according to an embodiment of a substrate processing apparatus.

FIG. 1 is a view illustrating a schematic configuration of a substrate processing system according to the embodiment. In the following, in order to clarify positional relationships, the X-axis, Y-axis and Z-axis are defined as being orthogonal to each other. The positive Z-axis direction is regarded as a vertically upward direction.

As illustrated in FIG. 1, a substrate processing system 1 includes a carry-in/out station 2 and a processing station 3. The carry-in/out station 2 and the processing station 3 are provided adjacent to each other.

The carry-in/out station 2 is provided with a carrier placing section 11 and a transfer section 12. In the carrier placing section 11, a plurality of carriers C is placed to accommodate a plurality of substrates (e.g., substrates W such as semiconductor wafers in the present embodiment) in a horizontal state.

The transfer section 12 is provided adjacent to the carrier placing section 11, and provided with a substrate transfer device 13 and a delivery unit 14 therein. The substrate transfer device 13 is provided with a substrate holding mechanism that holds the substrate W. Further, the substrate transfer device 13 is movable horizontally and vertically and pivotable around a vertical axis, and transfers the substrate W between the carrier C and the delivery unit 14 by using the substrate holding mechanism.

The processing station 3 is provided adjacent to the transfer section 12. The processing station 3 is provided with a transfer section 15 and a plurality of processing units 16. The plurality of processing units 16 are provided at both sides of the transfer section 15.

The transfer section 15 is provided with a substrate transfer device 17 therein. The substrate transfer device 17 is provided with a substrate holding mechanism that holds the substrate W. Further, the substrate transfer device 17 is movable horizontally and vertically and pivotable around a vertical axis, and transfers the substrate W between the delivery unit 14 and the processing units 16 by using the substrate holding mechanism.

The processing unit 16 performs a predetermined substrate processing on the substrate W transferred by the substrate transfer device 17.

Further, the substrate processing system 1 includes a control device 4. The control device 4 is, for example, a computer, and includes a controller 18 and a storage unit 19. The storage unit 19 stores a program that controls various processings performed in the substrate processing system 1. The controller 18 controls the operation of the substrate processing system 1 by reading and executing the program stored in the storage unit 19.

The program may be recorded in a computer-readable recording medium, and installed from the recording medium to the storage unit 19 of the control device 4. The computer-readable recording medium may be, for example, a hard disk (HD), a flexible disk (FD), a compact disk (CD), a magnet optical disk (MO), or a memory card.

In the substrate processing apparatus 1 configured as described above, the substrate transfer device 13 of the carry-in/out station 2 first takes out the substrate W from the carrier C placed in the carrier placing section 11, and then, places the taken-out substrate W on the delivery unit 14. The substrate W placed on the delivery unit 14 is taken out from the delivery unit 14 by the substrate transfer device 17 of the processing station 3, and carried into the processing unit 16.

The substrate W carried into the processing unit 16 is processed by the processing unit 16, and then, carried out from the processing unit 16 and placed on the delivery unit 14 by the substrate transfer device 17. Then, the processed substrate W placed on the delivery unit 14 is returned to the carrier C of the carrier placing section 11 by the substrate transfer device 13.

Figure 2:
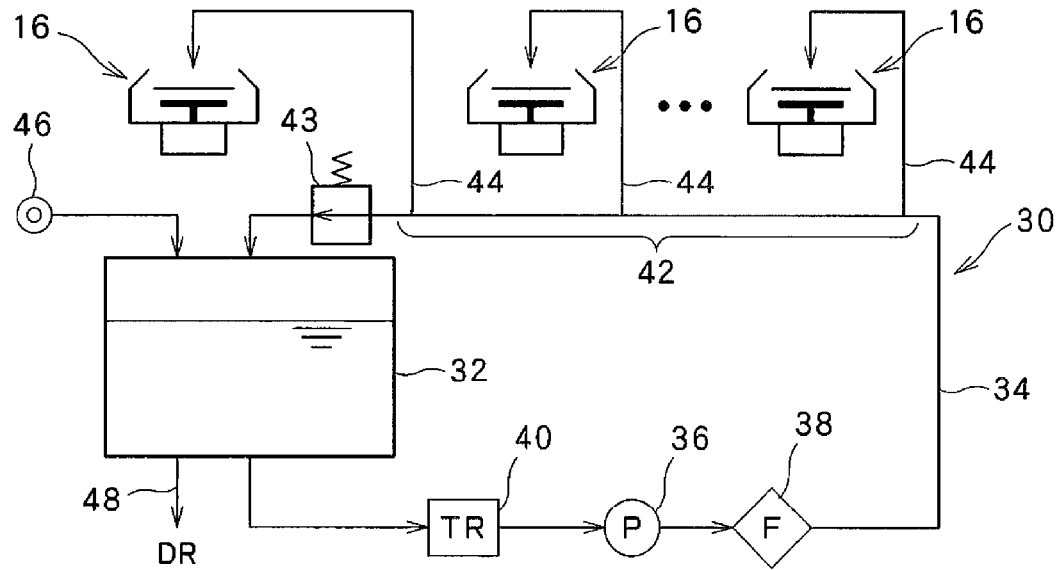
FIG. 2 is a schematic cross-sectional view illustrating a configuration of a processing liquid supply mechanism of the substrate processing apparatus illustrated in FIG. 1.

Next, a processing fluid supply system configured to supply a processing liquid to the plurality of processing units 16 will be described with reference to FIGS. 2 and 3. The processing liquid supply system includes a chemical liquid supply system, and a piping system of the chemical liquid supply system is illustrated in FIG. 2.

The chemical liquid supply system 30 includes a tank 32 that stores a chemical liquid, and a circulation line 34 that comes out of the tank 32 and returns to the tank 32. A pump 36 is provided in the circulation line 34. The pump 36 forms a circulating flow that comes out of the tank 32 and returns to the tank 32 through the circulation line 34. The circulation line 34 is provided with a filter 38 that removes contaminants such as particles contained in the chemical liquid, and a temperature regulator 40 that regulates the temperature of the chemical liquid to a predetermined temperature. When the chemical liquid is supplied to the substrate W at room temperature, a temperature regulator 40 that performs cooling and heating using a Peltier device may be used.

A plurality of branch lines (also referred to as "dispense lines") 44 is connected in parallel to connection areas 42 set in the circulation line 34. Each branch line 44 supplies the chemical liquid flowing in the circulation line 34 to the corresponding processing unit 16. In order to stabilize the pressure in the connection area 42 of the circulation line 34, a constant pressure valve 43 is provided on the downstream side of the connection area 42.

The chemical liquid supply system 30 further includes a tank liquid replenishing unit 46 that replenishes the chemical liquid or the chemical liquid constituent component in the tank 32. A drain unit 48 is provided in the tank 32 to discard the chemical liquid within the tank 32.

Figure 3:
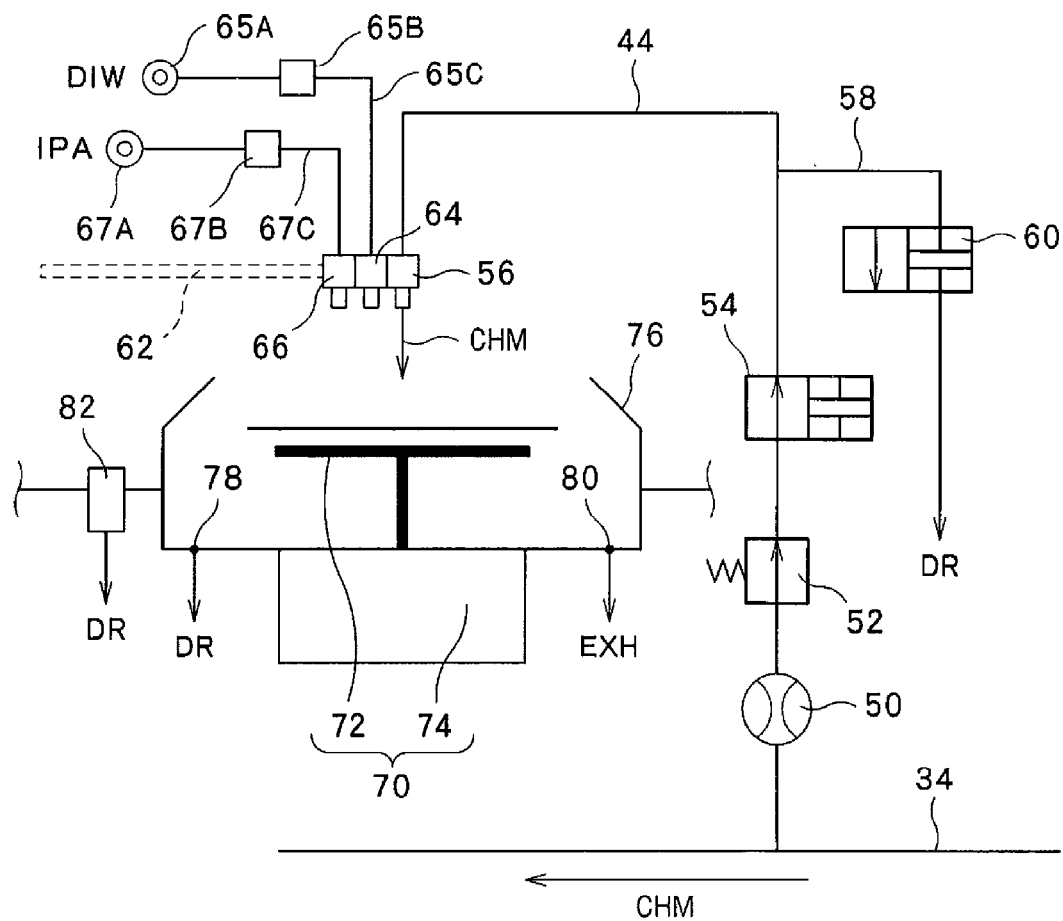
FIG. 3 is a schematic piping system view illustrating a configuration of the processing liquid supply mechanism related to one processing unit illustrated in FIG. 2.

As illustrated in FIG. 3, one branch line 44 is provided with a flow meter 50, a constant pressure valve 52 as a flow control valve, and an opening/closing valve 54 in this order from the upstream side. A chemical liquid nozzle 56 is provided at the downstream end of the branch line 44. A drain line 58 is branched from the branch line 44 between the opening/closing valve 54 and the chemical liquid nozzle 56. An opening/closing valve 60 is provided in the drain line 58.

The flow meter 50 and the constant pressure valve 52 constitute a flow rate adjusting unit that adjusts the flow rate of the chemical liquid flowing through the branch line 44. The constant pressure valve 52 operates such that a secondary-side pressure is implemented according to an operation pressure (air pressure) supplied to a pilot port of the constant pressure valve 52 from an electropneumatic regulator (not illustrated). The operation pressure supplied to the pilot port of the constant pressure valve 52 is feedback-controlled by a control device (the control device 4 in FIG. 1 or its subordinate controller) such that a detected flow rate of the flow meter 50 becomes a desired value (set value).

The chemical liquid nozzle 56 is supported by the tip of a nozzle arm 62 schematically illustrated in FIG. 3. A rinse nozzle 64 and an IPA nozzle 66 are also supported by the tip of the nozzle arm 62. At least one of the rinse nozzle 64 and the IPA nozzle 66 may be supported by a nozzle arm (not illustrated) other than the nozzle arm 62.

A rinse liquid (e.g., DIW) may be supplied at a controlled flow rate from a rinse liquid supply source 65A to the rinse nozzle 64 via a rinse liquid line 65C provided with a rinse liquid supply controller 65B. The rinse liquid supply controller 65B includes, for example, an opening/closing valve and a flow rate control valve (both not illustrated) configured to switch between the supply of the rinse liquid and stop of the supply and to control the supply flow rate of the rinse liquid.

IPA (isopropyl alcohol) may be supplied from an IPA supply source 67A to the IPA nozzle 66 via an IPA line 67C provided with an IPA supply controller 67B at a controlled flow rate. The IPA supply controller 67B includes, for example, an opening/closing valve and a flow rate control valve (both not illustrated) configured to switch between the supply of the IPA and stop of the supply and to control the supply flow rate of the IPA.

The processing unit 16 includes a spin chuck (substrate holding and rotating mechanism) 70. The spin chuck 70 includes a substrate holder (chuck) 72 that holds the substrate W in a horizontal posture and a rotation driver 74 that rotates the substrate holder 72 and the substrate W held by the substrate holder 72 around a vertical axis.

The substrate holder 72 may be of a type called a mechanical chuck that mechanically holds the peripheral edge of the substrate W by a holding member such as a gripping claw, and of a type called a vacuum chuck that vacuum-adsorbs the central portion of the rear surface of the substrate W. The rotation driver 74 may be constituted by, for example, an electric motor.

A liquid receiving cup 76 is provided around the substrate holder to collect the processing liquid scattered from the rotating substrate W. The processing liquid collected by the liquid receiving cup 76 is discharged to the outside of the processing unit 16 through a drain port 78 provided in the bottom portion of the liquid receiving cup 76. An exhaust port 80 is also provided in the bottom portion of the liquid receiving cup 76, and the inside of the liquid receiving cup 76 is sucked through the exhaust port 80.

The chemical liquid nozzle 56, the rinse nozzle 64, and the IPA nozzle 66 may be moved between a position directly above the central portion of the substrate W held by the spin chuck 70 (processing position) and a position outside (radially outside) the liquid receiving cup 76 by the nozzle arm 62 (retracted position). A dummy dispense port 82 is provided below the chemical liquid nozzle 56, the rinse nozzle 64, and the IPA nozzle 66 to receive the liquid ejected from the nozzles 56, 65, and 66 at the retracted position.

Next, a series of steps of the liquid processing performed on the substrate W in the processing unit 16 will be described with reference to time charts in FIG. 4 and schematic views in FIGS. 5A to 5H. As an example, the substrate W is a semiconductor wafer, the liquid processing is a chemical liquid processing performed in BEOL (wiring process), and the chemical liquid used in the chemical liquid processing may be an organic chemical liquid including, for example, buffered fluoride (BHF), dilute fluoride (DHF), and ammonium fluoride ($NH_4F$). All the processing liquids (e.g., pre-wet liquid or chemical liquid) used in the following liquid processing are at room temperature. The types of the liquid processing, the chemical liquid used, and the temperature of the processing liquid described above are illustrative, and are not limited to those described above.

Figure 4:
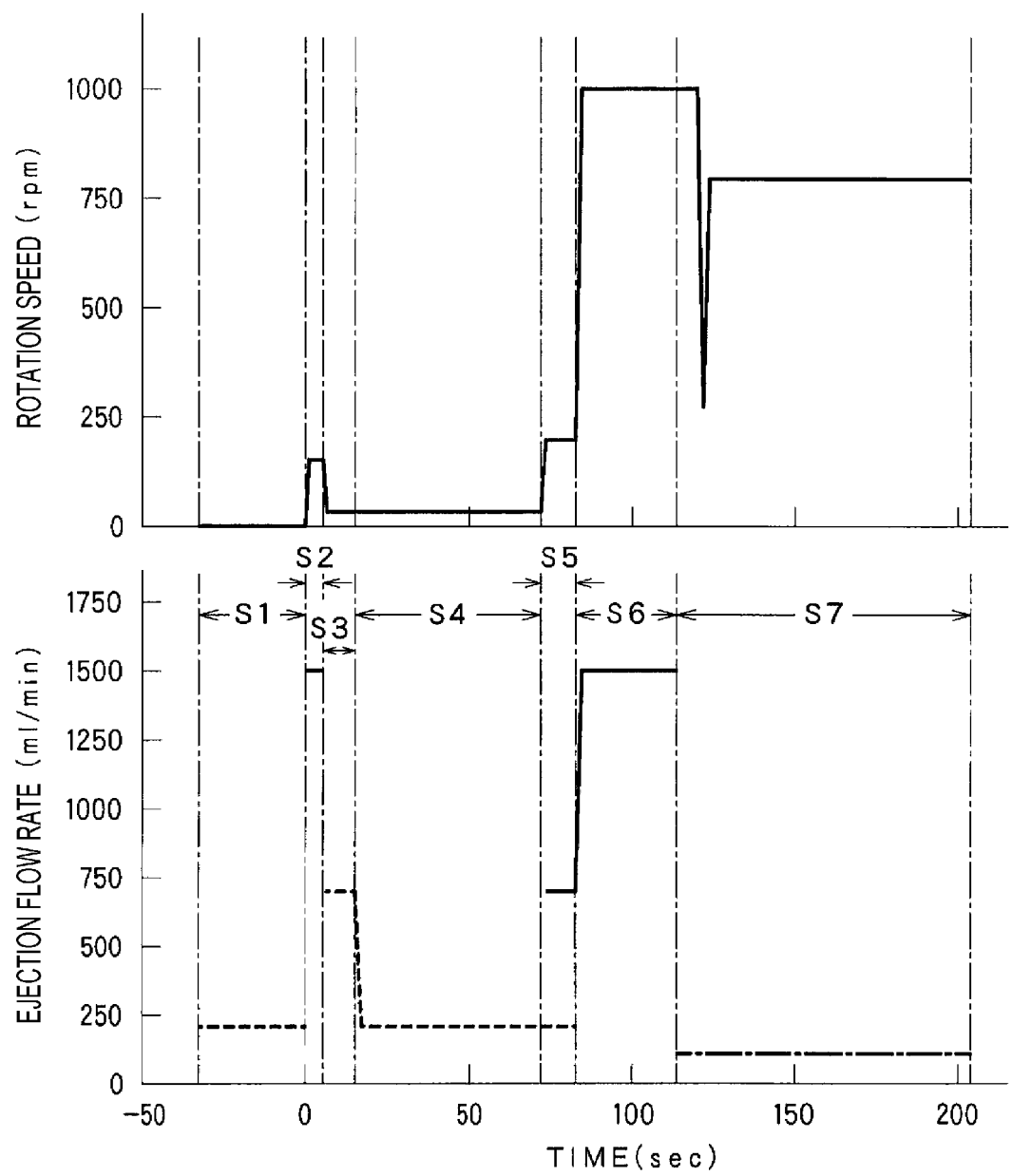
FIG. 4 illustrates time charts illustrating a rotation speed of a substrate and a discharge flow rate of a processing liquid in each step of the liquid processing in an embodiment.

In the time charts in FIG. 4, the upper time chart illustrates the rotation speed of the substrate W, and the lower time chart illustrates the ejection flow rate of the processing liquid (the broken line indicates chemical liquid, the solid line indicates pre-wet liquid and rinse liquid, and the alternate long and short dash line indicates IPA).

It should be noted that the embodiment is to prevent or suppress not only particles having a size required to be reduced in the related art, but also particles having a smaller size (hereinafter, referred to as "small size" in the present specification) (e.g., particles having a size of approximately 13 nm) from adhering to the substrate W. The particles having a small size may be generated, for example, at the opening/closing valve 54, as a result of dust generation due to interference (e.g., friction) between the valve body and the valve seat when the valve body is separated from the valve seat or when the valve body is sat on the valve seat. Although dust generation may occur theoretically in other valves (e.g., flow rate control valve 52) having a movable portion provided on the branch line 44, but the possibility of dust generation at the flow rate control valve 52 used in the processing liquid supply system of the semiconductor manufacturing apparatus is much lower than the case of the opening/closing valve 54, and thus, the flow rate control valve 52 is not considered in the present specification.

Chemical Liquid Dummy Dispense Step (Step S1)

The substrate W is carried into the processing unit 16, and held by the spin chuck 70. When the substrate W is carried into the processing unit 16, the chemical liquid nozzle 56 is positioned at the retracted position, that is, directly above the dummy dispense port 82. From this state, first, the opening/closing valve 54 is opened to perform a dummy dispense in which the chemical liquid is ejected from the chemical liquid nozzle 56 toward the dummy dispense port 82 for a predetermined time (see FIG. 5A).

The dummy dispense is performed at least until all the chemical liquid staying in the section of the dispense line 44 from the opening/closing valve 54 to the chemical liquid nozzle 56 is ejected from the chemical liquid nozzle 56. Specifically, for example, the dummy dispense is performed for 30 seconds with the ejection flow rate of the chemical liquid from the chemical liquid nozzle 56 set to 200 mL/min. The ejection flow rate of the chemical liquid may be increased to shorten the ejection time.

The dummy dispense may be performed at least until all the chemical liquid staying in the entire area of the branch line 44 (i.e., the section from the connecting point with the circulation line 34 to the chemical liquid nozzle 56) is ejected from the chemical liquid nozzle 56.

Contaminants such as particles staying in the flow path inside the chemical liquid nozzle 56 or the branch line 44 or adhering to the liquid contact surface may be discharged by performing the dummy dispense. Further, by discharging at least all the chemical liquid staying in the section of the branch line 44 from the opening/closing valve 54 to the chemical liquid nozzle 56 from the chemical liquid nozzle 56 during the dummy dispense, it is possible to prevent the dust (particles) generated at the opening/closing valve 54 from remaining in the chemical liquid temporarily staying in the branch line 44 immediately after the dummy dispense is stopped. Further, even when the inside of the nozzle is contaminated by the atmosphere around the chemical liquid nozzle 56 by performing the dummy dispense, the contaminants may be discharged.

When the chemical liquid nozzle 56 and the rinse nozzle 64 are supported by another nozzle arm, at least a part of the period during which the chemical liquid dummy dispense step is performed may be overlapped with a period during which a pre-wet step described later is performed.

Pre-Wet Step (Step S2)

After the chemical liquid dummy dispense step is completed, the rinse nozzle 64 is positioned at the position directly above the central portion of the substrate W, and the substrate W is rotated at a relatively low rotation speed (e.g., 100 to 150 rpm). In this state, a clean liquid serving as a pre-wet liquid (here, deionized water (DIW)) is ejected from the rinse nozzle 64 at a large flow rate (e.g., 1,500 mL/min) (see FIG. 5B). The pre-wet step is performed, for example, for 5 seconds. The pre-wet liquid adhering to the central portion of the substrate W flows to be spread toward the peripheral edge of the substrate W by centrifugal force, whereby the entire surface of the substrate W is covered with the liquid film of the pre-wet liquid.

At the initial stage of discharging the pre-wet liquid, dust due to dust generation according to the opening of the opening/closing valve as described later may be contained in the pre-wet liquid, but the pre-wet liquid is supplied at a large flow rate, and thus, dust (particle-causing substance) hardly adheres to the surface of the substrate W.

As long as a relatively thick pre-wet liquid (DIW) liquid film (i.e., liquid film that does not easily disappear by shaking off) is uniformly formed on the entire surface of the substrate W, the rotation speed of the substrate W and the ejection flow rate of the pre-wet liquid in the pre-wet step are not limited to those described above. As an example, in a case where a hydrophobic surface and a hydrophilic surface are mixed on the surface of the substrate W, it is desirable to set the rotation speed of the substrate to be high from the viewpoint of the uniformity of the liquid film. In this case, the ejection flow rate of the pre-wet liquid may be increased to form a relatively thick liquid film.

In order to confirm the effect of the pre-wet step, the processing was actually performed under the conditions based on the embodiment described in the present specification (with the pre-wet step), and under the conditions different only in that there is no pre-wet step. As a result, the number of particles in the case where there is the pre-wet step is approximately 50% of the number of particles in the case where there is no pre-wet step.

Further, the processing under the conditions based on the embodiment described in the present specification is performed while changing the rotation speed of the substrate in the pre-wet step (ejection flow rate is fixed at 1,500 mL/min). As a result, it is confirmed that, as the rotation speed decreases (that is, the film thickness increases), the number of particles decreases.

Dilute ammonia water may also be used as the pre-wet liquid. Further, the dilute ammonia water may be used as a rinse liquid in a rinse step described later. In general, it is known that, since a zeta potential on a solid surface (both the substrate surface and the particle surface) becomes negative in an alkaline liquid, particles are less likely to adhere. Even in the embodiment in which the adhesion of particles is required to be suppressed, it is beneficial to use the dilute ammonia water as at least one of the pre-wet liquid and the rinse liquid. In practice, as a result of using the dilute ammonia water as the pre-wet liquid and the rinse liquid, it is confirmed that particles are further reduced as compared with the case where DIW is used.

In the present specification, the expression "the nozzle is positioned directly above the central portion of the substrate W" is not limited to the fact that the nozzle is positioned directly above the rotation center point of the substrate W. As long as the liquid ejected from the nozzle and adhering to the surface of the substrate W is spread to such an extent that the rotation center point of the substrate W may be wet immediately after the liquid adheres thereto, the nozzle may be deviated from the rotation center point of the substrate W.

In the embodiment, the "liquid film" is formed on the surface of the substrate W by the liquid adhering to the central portion of the rotating substrate W and flowing to be spread toward the peripheral edge of the substrate W by centrifugal force regardless of the type of the liquid. Basically, the thickness of the liquid film is determined according to the rotation speed of the substrate W and the ejection flow rate of the liquid from the nozzle.

DIW and dilute ammonia water used as the pre-wet liquid have a higher cleanliness than the chemical liquid. The term "higher cleanliness" means that the content of particle-causing substance (particles such as dust, meaning substances that generate particles by precipitation or the like) is small.

Initial Thick Film Forming Step (Step S3)

Next, the ejection of the pre-wet liquid (DIW) from the rinse nozzle 64 is stopped and the rinse nozzle 64 is retracted from the position directly above the central portion of the substrate W, so that the chemical liquid nozzle 56 is positioned at the position directly above the central portion of the substrate W. Then, the opening/closing valve 54 is opened to eject the chemical liquid from the chemical liquid nozzle 56 at an ejection flow rate (e.g., an intermediate flow rate of approximately 700 mL/min) larger than that of the main processing step to be subsequently performed (see FIG. 5C). The rotation speed of the substrate W is lowered to a value (e.g., extremely low speed of approximately 30 to 50 rpm) lower than that of the pre-wet step substantially at the same time when the liquid ejection is switched from the rinse nozzle 64 to the chemical liquid nozzle 56.

An initial thick film forming step is performed at least until all the chemical liquid staying in the section of the dispense line 44 between the opening/closing valve 54 and the downstream side is ejected from the chemical liquid nozzle 56 until the time immediately before the initial thick film forming step starts. Since it is not desirable to increase the total ejection amount of the chemical liquid in the initial thick film forming step from viewpoint of saving the chemical liquid, the initial thick film forming step may be performed until all the chemical liquid staying in the section of the branch line 44 between the opening/closing valve 54 and the downstream side is exactly discharged. As an example, the initial thick film forming step is performed for approximately 10 seconds.

Figure 6:
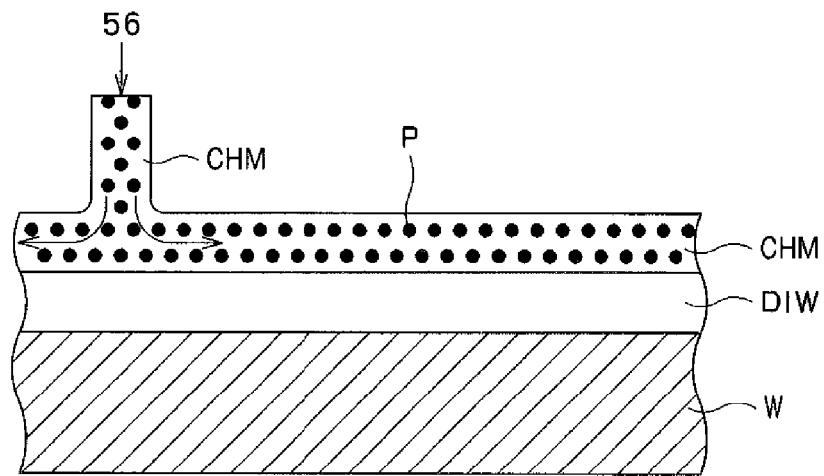
FIG. 6 is a schematic view illustrating an initial state of an initial thick film forming step.

As schematically illustrated in FIG. 6, in the early period of the initial thick film forming step, the chemical liquid is supplied from the chemical liquid nozzle 56 onto the liquid film of the pre-wet liquid (DIW) formed by the pre-wet step and having a high cleanliness (containing substantially no contaminants). At this time, for example, since the valve body is moved with respect to the valve seat when the opening/closing valve 54 is opened, dust generation may occur, which may cause particles having a small size. The dust (particles) generated here is supplied to the substrate W together with the chemical liquid. The chemical liquid containing the dust falls on the liquid film of the pre-wet liquid that acts as a protective film. Although the chemical liquid and the pre-wet liquid are mutually diffused, but it is difficult for the dust in the chemical liquid to reach the surface of the substrate W, and the dust hardly adheres to the surface of the substrate W. That is, in the early period of the initial thick film forming step, the adhesion of the dust to the surface of the substrate is prevented by the protective effect of the liquid film of the pre-wet liquid.

Figure 7:
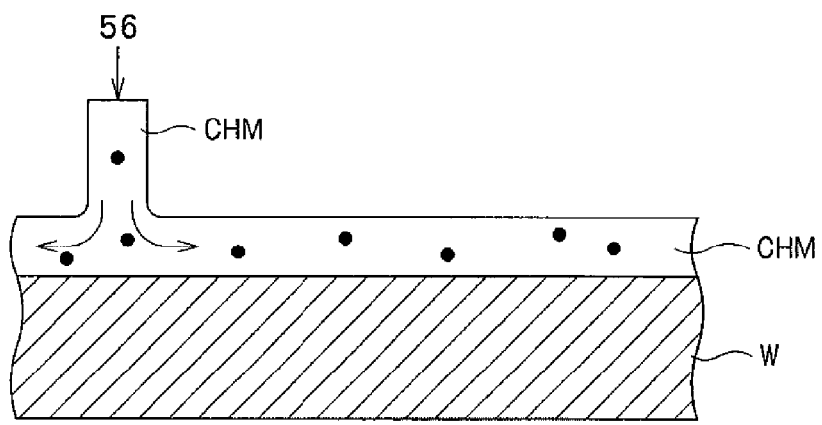
FIG. 7 is a schematic view illustrating a final state of the initial thick film forming step.

With the lapse of time from the start of the initial thick film forming step, the pre-wet liquid is replaced with the chemical liquid, and finally, as schematically illustrated in FIG. 7, the chemical liquid is substantially only present on the surface of the substrate W. The initial thick film forming step is performed under the condition that all the chemical liquid staying in the section of the branch line 44 between the opening/closing valve 54 and the downstream side is completely ejected from the chemical liquid nozzle 56 at this time. At the time when all the chemical liquid staying in the section of the branch line 44 between the opening/closing valve 54 and the downstream side is completely ejected from the chemical liquid nozzle 56, the dust derived from the valve is not contained or is hardly contained in the chemical liquid ejected from the chemical liquid nozzle 56 (see FIG. 7). Even when the chemical liquid ejected from the chemical liquid nozzle 56 contains some dust, the chemical liquid is supplied at a relatively large flow rate (e.g., 700 mL/min) in the initial thick film forming step, so that the thickness of the film of the chemical liquid formed on the surface of the substrate W in the final period of the initial thick film forming step is relatively thick. As a result, the probability that the dust in the liquid film comes into contact with the surface of the substrate W is low, and the dust hardly adheres to the surface of the substrate W.

Figure 8:
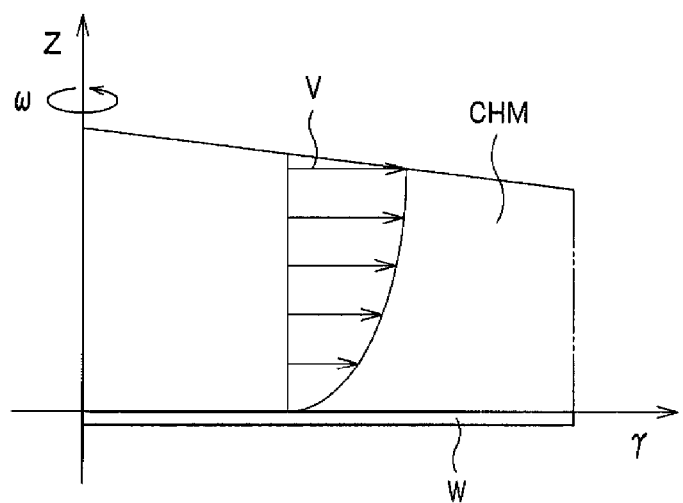
FIG. 8 is a schematic view illustrating a flow velocity distribution of a chemical liquid in a liquid film of the chemical liquid.

As illustrated in FIG. 8, the flow velocity of the liquid flowing from the central portion of the substrate W toward the peripheral edge is lower as it is closer to the surface of the substrate W, and higher as it is closer to the surface of the liquid film (the length of the arrow with the reference numeral V indicates the velocity). In the vicinity of the surface of the substrate where the flow velocity is low, the dust (particle-causing substance) contained in the chemical liquid is likely to adhere to the surface of the substrate W. When the thickness of the film of the chemical liquid is thin, most of the dust contained in the chemical liquid moves in the vicinity of the surface of the substrate W at a low speed, and thus, the dust easily adheres to the surface of the substrate W. Further, once the dust (particularly, having the small size described above) adheres to the surface of the substrate W, it is difficult to be separated from the surface of the substrate W even when the dust is exposed to a liquid flow at a low flow velocity. When the thickness of the film of the chemical liquid is thick, most of the dust contained in the chemical liquid flows at a relatively high speed toward the peripheral edge of the substrate W at a position relatively distant from the surface of the substrate, and thus, the amount of the dust adhering to the surface of the substrate W is reduced. That is, when the chemical liquid containing a certain amount of dust is supplied to the substrate W, the adhesion of the dust (particle) may be suppressed by setting a large flow rate and a rotation speed of the substrate W that forms a thick film thickness. In consideration of this, the ejection flow rate of the chemical liquid and the rotation speed of the substrate W in the initial thick film forming step are determined.

An experiment is conducted to consider the conditions of the initial thick film forming step. The rotation speed of the substrate is fixed at 50 rpm, and the ejection flow rate of the chemical liquid is changed from 200 to 700 mL/min. As a result, it may be confirmed that, as the ejection flow rate of the chemical liquid increases, the particle level adhering to the substrate decreases. Further, the ejection flow rate of the chemical liquid is fixed at 200 mL/min, and the rotation speed of the substrate is changed from 50 to 300 rpm. As a result, it may be confirmed that, as the rotation speed of the substrate decreases, the particle level adhering to the substrate decreases. From this, it may be said that, as the thickness of the liquid film formed in the initial thick film forming step increases, the particle level decreases.

Main Processing Step (Chemical Liquid Processing) (Step S4)

Next, while maintaining the rotation speed of the substrate W at an extremely low speed (e.g., the same speed as the initial thick film forming step), the ejection flow rate of the chemical liquid from the chemical liquid nozzle 56 is lowered to a small flow rate (e.g., 200 mL/min) to perform a main processing step (see FIG. 5D). At this time, the thickness of the liquid film on the surface of the substrate W becomes thin by reducing the ejection flow rate of the chemical liquid. Of course, the ejection flow rate of the chemical liquid is maintained at a value equal to or higher than the value that ensures the entire surface of the substrate W to be seamlessly covered with the liquid film of the chemical liquid. As an example, the main processing step is performed for approximately 70 to 80 seconds.

At the time when the main processing step is started, substantially all the dust (particles) derived from the valve is ejected from the chemical liquid nozzle, and thus, the cleanliness of the chemical liquid supplied to the substrate W is high as compared with that in the initial thick film forming step. As a result, even when the thickness of the liquid film becomes thin, the adhesion of the dust to the surface of the substrate W is prevented or sufficiently suppressed. The main processing step is performed until a desired chemical liquid processing on the surface of the substrate W is completed (e.g., until a desired etching amount is obtained). Since the ejection flow rate of the chemical liquid is suppressed to a low level in the main processing step, the processing cost in a case of using a particularly expensive chemical liquid may be reduced.

Switching Step (Transition from Main Processing Step to Rinse Step) (Step S5)

Next, while maintaining the ejection flow rate of the chemical liquid from the chemical liquid nozzle 56, the rinse nozzle 64 is positioned at the position directly above the central portion of the substrate W, DIW (pure water) serving as the rinse liquid is ejected from the rinse nozzle 64 at an intermediate flow rate (e.g., 700 mL/min), and the rotation speed of the substrate is increased to a low speed (e.g., 200 rpm) (see FIG. 5E). At this time, the liquid may be suppressed from splashing by suppressing the ejection flow rate of the rinse liquid to a low level as described above. When liquids are supplied from two nozzles 56 and 64 at the same time, liquid splashing may occur due to interference of different liquid flows on the surface of the substrate W. The splashed liquid may be splashed again in the cup and adhere again to the surface of the substrate W, which may cause particles. However, the liquid splashing may be prevented by suppressing the ejection flow rate from each of the nozzles 56 and 64 to a low level. Further, by simultaneously supplying liquids from two nozzles 56 and 64, the liquid film is not torn finely, and the surface of the substrate W is not exposed even when the ejection flow rate of the liquid from each nozzle is suppressed to a low level. The period during which the ejection of the liquid from the chemical liquid nozzle 56 and the rinse nozzle 64 is performed simultaneously may be set to, for example, 10 seconds.

Rinse Step (Step S6)

Next, the ejection of the chemical liquid from the chemical liquid nozzle 56 is stopped, and the flow rate of the rinse liquid from the rinse nozzle 64 is increased to a large flow rate (e.g., 1,500 mL/min). In addition, the rotation speed of the substrate is increased to a high speed (e.g., 1,000 rpm) (see FIG. 5F). The rinse step may be performed for a time required to sufficiently remove the chemical liquid used in the main processing step and the generated reaction products, for example, approximately 30 seconds.

As long as a region that is not covered with the liquid is not generated on the surface of the substrate W, the main processing step may proceed directly to the rinse step without performing the switching step. That is, the ejection of the DIW from the rinse nozzle 64 may be started simultaneously with, or substantially simultaneously with the stop of the ejection of the chemical liquid from the chemical liquid nozzle 56.

IPA Replacing Step (Step S7)

While maintaining the rotation speed of the substrate W at a high speed (e.g., 1,000 rpm), the ejection of the DIW from the rinse nozzle 64 is stopped. In addition, the IPA nozzle 66 is positioned at the position directly above the central portion of the substrate W, and IPA is ejected from the IPA nozzle 66 at a small flow rate of, for example, approximately 100 mL/min for 0.5 seconds (see FIG. 5G). Thereafter, while reducing the rotation speed of the substrate to an intermediate speed (e.g., 300 rpm), and maintaining the ejection flow rate of the IPA from the IPA nozzle 66, the IPA nozzle 66 reciprocates between the position directly above the central portion of the substrate W and the position directly above the peripheral edge of the substrate W (see FIG. 5H). Therefore, the DIW on the surface (including the inside of a recess of a pattern) of the substrate W is replaced with the IPA.

Dry Step

Next, the rotation speed of the substrate W is maintained or increases, and the ejection of the IPA from the IPA nozzle 66 is stopped. Therefore, the IPA is removed from the surface of the substrate W, and the substrate W is dried. The dry step is not illustrated in the time charts in FIG. 4. When the substrate W is dried, the rotation of the substrate W is stopped. Thus, a series of processings for the substrate is completed. Thereafter, the processed substrate W is carried out from the processing unit 16.

Effect of Embodiment

When the chemical liquid is supplied to the rotating substrate at a large flow rate during the chemical liquid processing, a thick liquid film is formed. Thus, particles are less likely to adhere to the surface of the substrate for the reasons described above. However, when the chemical liquid is expensive, it is required to reduce the consumption amount of the chemical liquid. Examples of the method for reducing the consumption amount of the chemical liquid may include a method in which the amount of the chemical liquid itself supplied to the substrate is reduced, or a method in which the used chemical liquid is collected and reused. In the latter case, it often does not meet recent particle reduction demands.

In the embodiment, even when the chemical liquid containing particle-causing substances having a small size is ejected onto the surface of the substrate, the chances of the particle-causing substances coming into contact with (i.e., adhering to) the surface of the substrate are greatly reduced by performing the pre-wet step and the initial thick film forming step. In the main processing step (chemical liquid processing), the chemical liquid containing the particle-causing substances suppressed to a sufficiently low amount is supplied to the substrate. As a result, even when the thickness of the liquid film becomes thin (i.e., even when the supply amount of the chemical liquid is reduced), there is no possibility that the particles having a small size adhere to the substrate. According to the embodiment, as compared with the case where the chemical liquid is constantly ejected at a large flow rate to perform the chemical liquid processing, it is possible to reduce the total consumption amount of the chemical liquid while suppressing the level of the particle adhering to the substrate to the same or lower.

The substrate is not limited to a semiconductor wafer, but may be an arbitrary type of substrate used in a technical field of manufacturing a semiconductor device such as a glass substrate or a ceramic substrate.

According to the present disclosure, it is possible to reduce the particles remaining on the substrate after the liquid processing while reducing the consumption amount of the chemical liquid.

From the foregoing, it will be appreciated that various embodiments of the present disclosure have been described herein for purposes of illustration, and that various Modifications may be made without departing from the scope and spirit of the present disclosure. Accordingly, the various embodiments disclosed herein are not intended to be limiting, with the true scope and spirit being indicated by the following claims.

What is claimed is:

1. A substrate processing method comprising:
supplying a pre-wet liquid to a substrate while the substrate is being rotated, and forming a liquid film of the pre-wet liquid on a surface of the substrate;
after the forming of the liquid film of the pre-wet liquid, performing a first chemical liquid processing comprising:
supplying a chemical liquid for etching or cleaning the substrate to the substrate at a first flow rate while the substrate is being rotated at a first rotation speed, causing the chemical liquid to flow from a central portion of the substrate to a peripheral edge of the substrate to cover the surface of the substrate, the first flow rate coupled with the first rotation speed being sufficient to: 1) form a first liquid film of the chemical liquid having a first thickness on the surface of the substrate, and 2) suppress the adherence of particles on the surface of the substrate;
after the first chemical liquid processing, performing a second chemical liquid processing comprising:
supplying the chemical liquid to the substrate at a second flow rate while the substrate is being rotated at a second rotation speed, causing the chemical liquid to flow from the central portion of the substrate to the peripheral edge of the substrate to cover the surface of the substrate, to form a second liquid film of the chemical liquid having a second thickness on the surface of the substrate, and
after the second chemical liquid processing, while maintaining the second flow rate of the chemical liquid, supplying a rinse liquid to the substrate;
after simultaneously supplying the chemical liquid and the rinse liquid, performing a rinse step by stopping a supply of the chemical liquid, and increasing a flow rate of the rinse liquid to the substrate until the chemical liquid and generated reaction products are sufficiently removed from the substrate,
wherein the pre-wet liquid and the rinse liquid are different from the chemical liquid, and
the first flow rate is larger than the second flow rate, the first thickness is thicker than the second thickness, and a processing time for the second chemical liquid processing is longer than a processing time for the first chemical liquid processing such that the first flow rate coupled with the first rotation speed is configured to suppress the adherence of particles on the surface of the substrate more than the second flow rate coupled with the second rotation speed.

2. The substrate processing method according to claim 1, wherein the first rotation speed is equal to or higher than the second rotation speed.

3. The substrate processing method according to claim 1, wherein the supply of the chemical liquid to the substrate is performed using a chemical liquid nozzle configured to eject the chemical liquid, a dispense line branched from a circulation line through which the chemical liquid is circulated and configured to supply the chemical liquid to the chemical liquid nozzle, and a chemical liquid supply provided in the dispense line and including a valve that selectively blocks the supply of the chemical liquid from the circulation line to the chemical liquid nozzle, and the substrate processing method further comprises:
before starting the first chemical liquid processing, discharging the chemical liquid staying in a section of the dispense line from the valve to the chemical liquid nozzle to a predetermined discharge location by opening the valve.

4. The substrate processing method according to claim 2, wherein the supply of the chemical liquid to the substrate is performed using a chemical liquid nozzle configured to eject the chemical liquid, a dispense line branched from a circulation line through which the chemical liquid is circulated and configured to supply the chemical liquid to the chemical liquid nozzle, and a chemical liquid supply provided in the dispense line and including a valve that selectively blocks the supply of the chemical liquid from the circulation line to the chemical liquid nozzle, and the substrate processing method further comprises:
before starting the first chemical liquid processing, discharging the chemical liquid staying in a section of the dispense line from the valve to the chemical liquid nozzle to a predetermined discharge location by opening the valve.

5. The substrate processing method according to claim 1, wherein the supply of the chemical liquid to the substrate is performed using a chemical liquid nozzle configured to eject the chemical liquid, a dispense line branched from a circulation line through which the chemical liquid is circulated and configured to supply the chemical liquid to the chemical liquid nozzle, and a chemical liquid supply provided in the dispense line and including a valve that selectively blocks the supply of the chemical liquid from the circulation line to the chemical liquid nozzle, and the first chemical liquid processing is performed at least until the chemical liquid, remaining in a section of the dispense line from the valve to the chemical liquid nozzle at least at a time when the valve is opened and the chemical liquid is started to be ejected from the chemical liquid nozzle to the substrate, is completely ejected from the chemical liquid nozzle.

6. The substrate processing method according to claim 2, wherein the supply of the chemical liquid to the substrate is performed using a chemical liquid nozzle configured to eject the chemical liquid, a dispense line branched from a circulation line through which the chemical liquid is circulated and configured to supply the chemical liquid to the chemical liquid nozzle, and a chemical liquid supply provided in the dispense line and including a valve that selectively blocks the supply of the chemical liquid from the circulation line to the chemical liquid nozzle, and the first chemical liquid processing is performed at least until the chemical liquid, remaining in a section of the dispense line from the valve to the chemical liquid nozzle at least at a time when the valve is opened and the chemical liquid is started to be ejected from the chemical liquid nozzle to the substrate, is completely ejected from the chemical liquid nozzle.

7. The substrate processing method according to claim 3, wherein the first chemical liquid processing is performed at least until the chemical liquid, remaining in the section of the dispense line from the valve to the chemical liquid nozzle at least at a time when the valve is opened and the chemical liquid is started to be ejected from the chemical liquid nozzle to the substrate, is completely ejected from the chemical liquid nozzle.

8. The substrate processing method according to claim 4, wherein the first chemical liquid processing is performed at least until the chemical liquid, remaining in the section of the dispense line from the valve to the chemical liquid nozzle at least at a time when the valve is opened and the chemical liquid is started to be ejected from the chemical liquid nozzle to the substrate, is completely ejected from the chemical liquid nozzle.

9. The substrate processing method according to claim 1, wherein the chemical liquid is an organic chemical liquid including buffered fluoride (BHF), dilute fluoride (DHF), or ammonium fluoride ($NH_4F$).

10. The substrate processing method according to claim 1, wherein the pre-wet liquid is deionized water (DIW) or dilute ammonia water.

11. The substrate processing method according to claim 1, wherein the first flow rate is 700 mL/min.

12. The substrate processing method according to claim 11, wherein the first rotation speed is 30 to 50 rpm.

* * * * *